United States Patent
Hariman et al.

(10) Patent No.: US 7,479,812 B1
(45) Date of Patent: Jan. 20, 2009

(54) PRODUCING A FREQUENCY-REPRESENTATIVE SIGNAL WITH RAPID ADJUSTMENT TO FREQUENCY CHANGES

(75) Inventors: George Adrian Hariman, Sunnyvale, CA (US); Kenji Tomiyoshi, Chiba (JP)

(73) Assignee: National Semiconductor Corporation, Santa Clara, CA (US)

( * ) Notice: Subject to any disclaimer, the term of this patent is extended or adjusted under 35 U.S.C. 154(b) by 194 days.

(21) Appl. No.: 11/139,902

(22) Filed: May 27, 2005

(51) Int. Cl.
*H03D 3/00* (2006.01)
(52) U.S. Cl. .................... 327/102; 327/103
(58) Field of Classification Search .......... 327/100, 327/102, 103, 47
See application file for complete search history.

(56) References Cited

U.S. PATENT DOCUMENTS

| | | | | |
|---|---|---|---|---|
| 4,598,251 A | * | 7/1986 | Wehrs | 327/102 |
| 5,144,156 A | * | 9/1992 | Kawasaki | 331/17 |
| 5,523,723 A | * | 6/1996 | Arcus et al. | 331/57 |
| 5,600,272 A | * | 2/1997 | Rogers | 327/157 |
| 5,736,879 A | * | 4/1998 | Pham | 327/102 |
| 6,111,440 A | | 8/2000 | Rajagopalan et al. | |
| 6,353,368 B1 | * | 3/2002 | Iravani | 331/57 |
| 6,407,618 B1 | * | 6/2002 | Taft et al. | 327/534 |
| 6,433,591 B2 | * | 8/2002 | Sasaki | 327/102 |
| 6,445,219 B1 | * | 9/2002 | Oppelt | 327/102 |
| 6,798,372 B1 | | 9/2004 | Yang et al. | |

OTHER PUBLICATIONS

T.Y. Lin et al., "Architecture for frequency-to-current conversion", Electronics Letters, Nov. 22, 2001, vol. 37, No. 24, pp. 1427-1428.

* cited by examiner

*Primary Examiner*—Lincoln Donovan
*Assistant Examiner*—Hai L. Nguyen

(57) ABSTRACT

A feed-forward path is combined with a feed-back path to produce an output signal representation of an input signal frequency. The feed-forward path adjusts the output signal representation in response to a change in the input signal frequency, and does so in a response time that is independent of the feed-back path. Input frequencies can be represented as voltages, and first and second input frequency ranges which differ from one another can both be represented in the same range of voltages.

18 Claims, 4 Drawing Sheets

PRODUCING A FREQUENCY-REPRESENTATIVE SIGNAL WITH RAPID ADJUSTMENT TO FREQUENCY CHANGES

TECHNICAL FIELD OF THE INVENTION

The invention relates generally to the use of periodic signaling and, more particularly, to producing an output signal that is representative of the frequency of an input periodic signal.

BACKGROUND OF THE INVENTION

There are myriad applications which require the capability to obtain information about the frequency of a periodic signal. Conventional frequency-to-current conversion circuits produce an output current that represents the frequency of an input periodic signal, and conventional frequency-to-voltage conversion circuits produce an output voltage that represents the frequency of an input periodic signal. These, conventional approaches typically use a feed-back loop to synchronize the output signal to the frequency of the periodic input signal. The feed-back loop requires a certain amount of locking time to lock the output signal representation to the frequency of the input signal. This locking time can present difficulties in some situations, for example, when the frequency of the input signal abruptly changes by a relatively large amount.

It is desirable in view of the foregoing to provide for an output signal representation of an input signal frequency while also avoiding the locking time associated with the operation of conventional feed-back control loops.

SUMMARY OF THE INVENTION

Exemplary embodiments of the invention combine a feed-forward path with a feed-back path to produce an output signal representation of an input signal frequency. The feed-forward path adjusts the output signal representation in response to a change in the input signal frequency, and does so in a response time that is independent of the feed-back path. In some embodiments, input frequencies are represented as voltages, and first and second input frequency ranges which differ from one another can both be represented in the same range of voltages.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 5, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged system.

Figure 1:
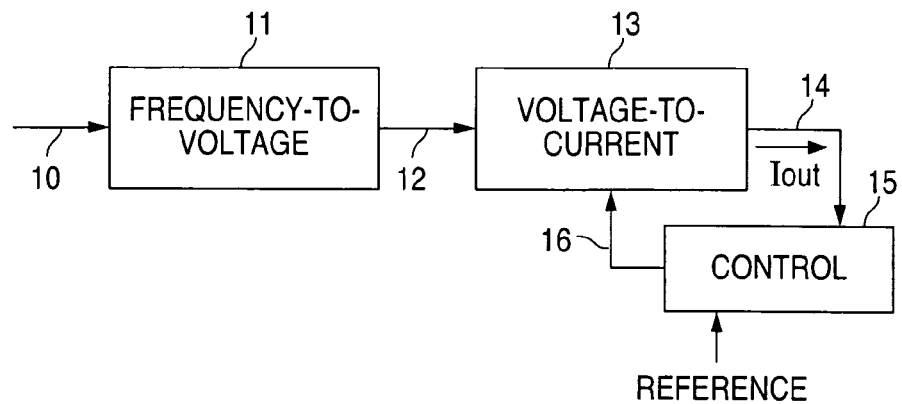
FIG. 1 diagrammatically illustrates exemplary embodiments of a frequency-to-current converter according to the invention.

FIG. 1 diagrammatically illustrates a frequency-to-current conversion apparatus according to exemplary embodiments of the invention. The apparatus of FIG. 1 includes a frequency-to-voltage converter 11 which produces at 12 an output voltage that represents the frequency of an input signal received at 10. In response to the voltage at 12, a voltage-to-current converter 13 produces at 14 an output current Iout that represents the frequency of the input signal received at 10. A feed-back control path (or loop) at 15 provides feed-back control signaling between the output 14 of the voltage-to-current converter 13 and another node 16 of the voltage-to-current converter 13. The feed-back control path 15 provides adjustment capability, but the combination of the frequency-to-voltage converter 11 and the voltage-to-current converter 13 represents a feed-forward path which permits the output 14 to adjust immediately to frequency changes at the input 10. As described in detail herein below, this feed-forward adjustment can be accomplished without incurring any time delay associated with operation of the feed-back control path 15.

Figure 2:
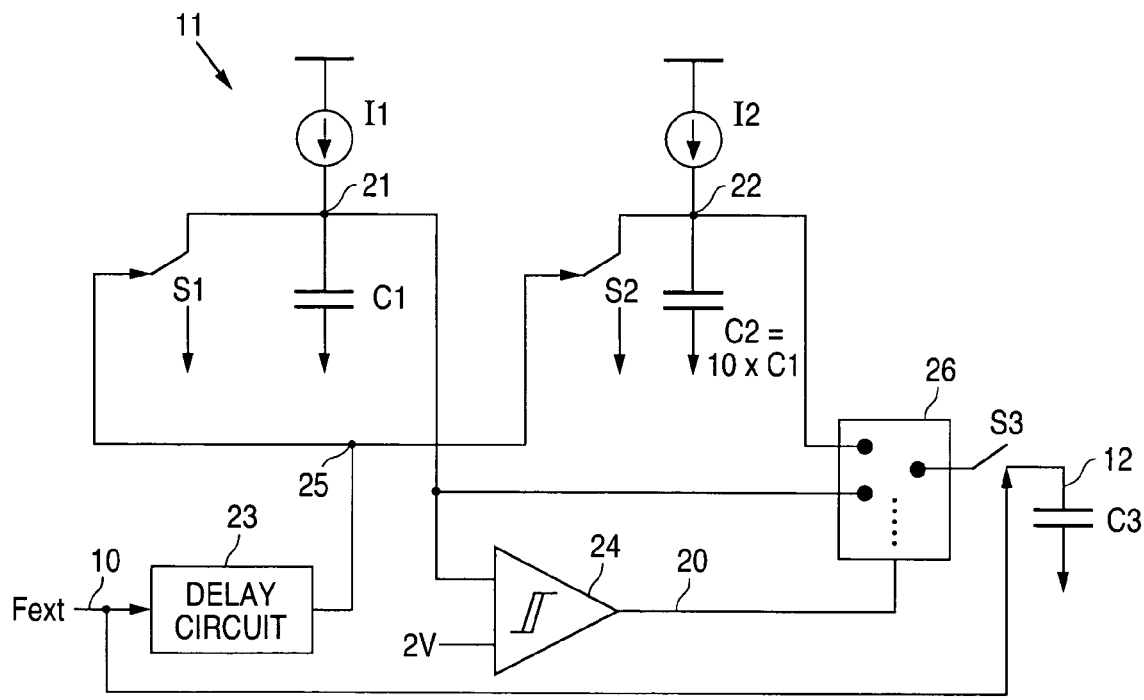
FIG. 2 diagrammatically illustrates a portion of FIG. 1 in more detail according to exemplary embodiments of the invention.

FIG. 2 illustrates the frequency-to-voltage converter 11 of FIG. 1 in more detail according to exemplary embodiments of the invention. The frequency-to-voltage converter 11 of FIG. 2 includes a first frequency-to-voltage conversion circuit including a current source I1 coupled in series with a parallel combination of a switch S1 and a capacitor C1. Similarly, a second frequency-to-voltage conversion circuit includes a current source I2 coupled in series with a parallel combination of a switch S2 and a capacitor C2. The switches S1 and S2 are controlled by a delayed version 25 of the input frequency Fext, which delayed version 25 is produced by a suitable delay circuit 23. The input frequency Fext also controls a switch S3 that is connected between a selector 26 and a sample/hold capacitor C3 (C3<C1, C3<C2) at the output 12 of the frequency-to-voltage converter 11. The selector 26 has a first input connected to a node 21 of the first frequency-to-voltage conversion circuit, and has a second input connected to a node 22 of the second frequency-to-voltage conversion circuit. Under control of the output 20 of a comparator 24, the selector 26 connects one of the nodes 21 and 22 to the switch S3. The comparator 24 compares the voltage at the node 21 to a reference voltage, in this example, a 2 volt reference voltage.

Figure 3:
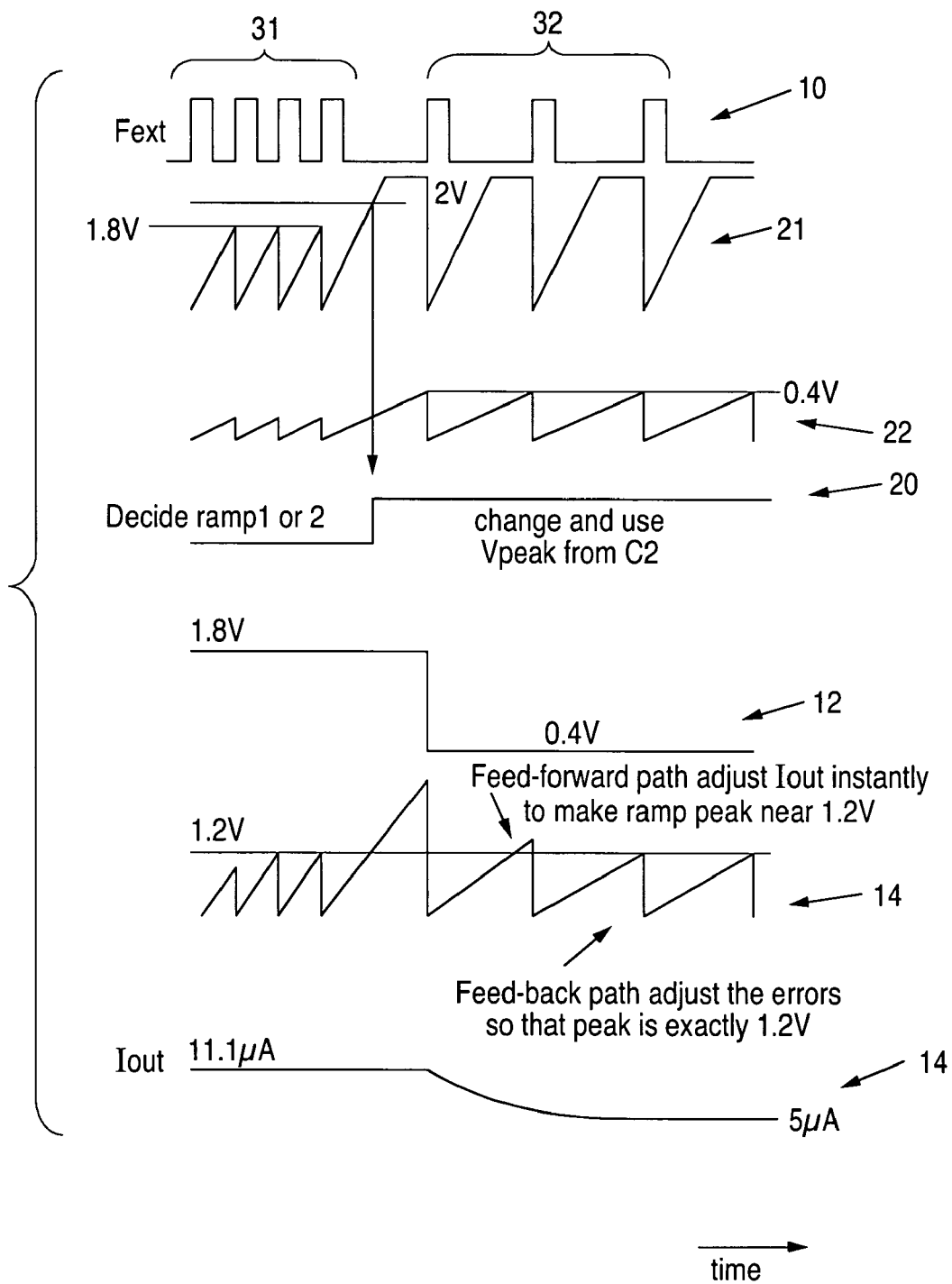
FIG. 3 is a timing diagram which illustrates selected signals from FIGS. 1, 2 and 4.

If the capacitor C2 is selected to have a larger value than the capacitor C1, while the currents I1 and I2 are selected to be the same, then the operation of switches S1 and S2 at the input frequency Fext will result in voltage waveforms at nodes 21 and 22 such as illustrated at 21 and 22 in FIG. 3. The ramp slope in the waveform at 21 is set by the current I1 and the capacitor C1, and the ramp slope in the waveform at 22 is set by the current I2 and the capacitor C2. For the example of FIG. 2, where C2 is 10×C1, the slope of the ramp at 21 is 10× the slope of the ramp at 22. The lower slope value of the ramp at 22 permits lower frequencies to be represented within the same voltage headroom as the higher frequencies that are represented at 21, without running into the upper limit of the available voltage headroom and clipping the top of the waveform (see 21 in FIG. 3). When the input frequency Fext changes from the higher frequency indicated at 31 to the lower frequency indicated at 32, the waveform at 21 clips off at the available voltage headroom (for example 3 volts), while the waveform at 22 can easily represent the lower frequency 32 as a waveform with a 0.4 volt peak.

Accordingly, and referring also FIG. 2, the comparator 24 determines when the voltage at node 21 goes above the 2 volt reference level, and changes its output voltage level 20 to indicate that the node 21 has exceeded the 2 volt reference level. This causes the selector 26 of FIG. 2 to switch such that the sampling switch S3 is no longer connected to node 21, but is now connected to node 22. This causes the sampled voltage across capacitor C3 at 12 to change from the 1.8 volt level associated with the peak voltage on node 21 at the higher frequency 31 to the 0.4 volt level associated with the peak voltage on node 22 at the lower frequency 32. In some embodiments, the ramp slope of the waveform at 21 in FIG. 3 is 2M V/s, and the ramp slope of the waveform at 22 in FIG. 3 is 200 kV/s. These slopes have a 10:1 ratio that corresponds to the aforementioned capacitance ratio where C2=10×C1, and with I1=I2. Because the ramp slope ratio of the waveforms at 21 and 22 is known, this factor can be compensated for by suitable adjustments in the voltage-to-current converter 13 (see also FIG. 1) as described hereinbelow.

Figure 4:
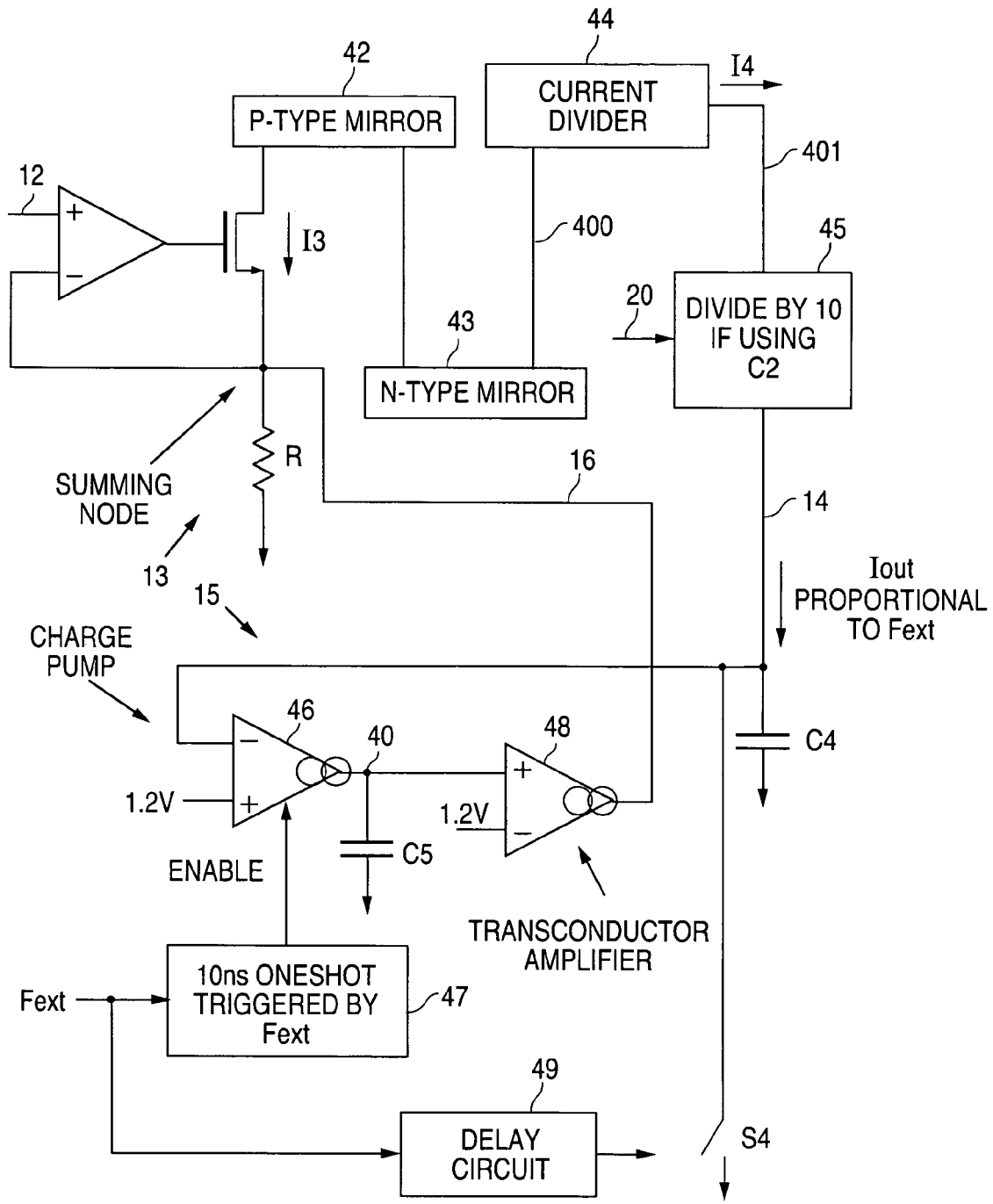
FIG. 4 diagrammatically illustrates a portion of FIG. 1 in more detail according to exemplary embodiments of the invention.

FIG. 4 diagrammatically illustrates the voltage-to-current converter 13 and the feed-back control path 15 of FIG. 1 in more detail according to exemplary embodiments of the invention. As shown in FIG. 4, a buffer and a resistor are used to convert the voltage 12 provided at the output of the frequency-to-voltage converter I1 into a current I3. In particular, the current I3 is simply the voltage at 12 divided by the resistance of the resistor R. A p-type current mirror 42, an n-type mirror current mirror 43, and current divider 44 together constitute a current modifier which produces a current I4 that is inversely proportional to the current I3. Because the peak voltages of the waveforms 21 and 22 (FIGS. 2 and 3) are inversely proportional to the input frequency Fext, this also means that the current I3 is inversely proportional to Fext. Accordingly, the current I4, which is inversely proportional to the current I3, is directly proportional to Fext.

At 45, the current I4 is selectively divided as necessary to compensate for the ramp slope ratio of the waveforms 21 and 22 of FIG. 3. In the example described above, the C2/C1 ratio is 10/1 and the ramp slope ratio between waveform 21 and waveform 22 of FIG. 3 is 10/1, so the divider at 45 divides the current I4 by 10 whenever the output 20 of the comparator 24 indicates that the capacitor C2 (and corresponding waveform 22 of FIG. 3) is being used to represent the input frequency Fext. This selective division, by the ramp slope ratio of 10 in this example, insures that the output current Iout at 14 compensates for the flatter ramp slope at 22 in FIG. 3.

As shown in FIG. 4, the output current Iout drives a capacitor C4 which is used in combination with the feed-back path 15 to increase the accuracy of the output current Iout. Note, however, that the output current Iout is produced via the aforementioned feed-forward path which causes Iout to track changes in Fext immediately, without incurring the delay associated with operation of the feed-back path 15.

Figure 5:
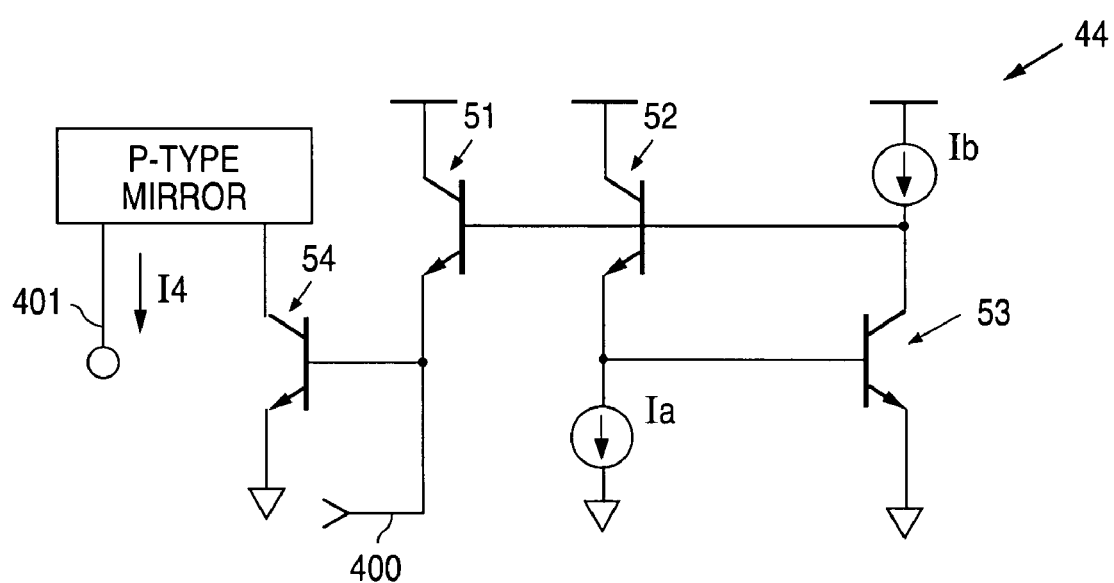
FIG. 5 diagrammatically illustrates a portion of FIG. 4 in more detail according to exemplary embodiments of the invention.

The feed-back path of FIG. 5 includes a 10 ns one-shot 47 triggered by Fext. The one-shot 47 is used to enable a charge-pump circuit 46 which monitors the peak voltage on capacitor C4 for the 10 ns period of the one-shot. During the 10 ns period, if the peak voltage on capacitor C4 exceeds a reference voltage of 1.2 volts, the charge pump 46 will pump a control voltage at 40 across capacitor C5. This control voltage at 40 is input to a transconductor amplifier 48 for comparison with the 1.2 volt reference. The output of the transconductor amplifier 48 is coupled to the node 16 of the frequency-to-current converter 13. In the example of FIG. 4, the node 16 is a current summing node, and the transconductor amplifier 48 either adds to or subtracts from the current going to the p-type mirror 42. In this fashion, the feed-back path at 15 can adjust I3 such that Iout, in cooperation with switch S4 (controlled by a delayed version of Fext produced by a suitable delay circuit 49) will maintain the peak voltage across capacitor C4 at 1.2 volts.

FIG. 3 illustrates the voltage and current at 14 in timewise correspondence with the other signals of FIG. 3. In response to an abrupt frequency change, the feed-forward path adjusts the voltage at 14 across capacitor C4 immediately to bring the peak voltage back near 1.2 volts. Thereafter, the feed-back path can operate to adjust for errors so that the peak voltage at 14 is maintained at 1.2 volts.

In one embodiment, the period of Fext at 31 is 900 ns, and the period of Fext at 32 is 2 us.

FIG. 5 diagrammatically illustrates the current divider 44 of FIG. 4 in more detail according to exemplary embodiments of the invention. As shown in FIGS. 4 and 5, the current divider 44 is coupled at 400 to the n-type current mirror 43, and produces the modified current I4 at 401. With the illustrated arrangement of transistors 51-54 and current sources Ia and Ib, operation of the current modifier 42-44 of FIGS. 4 and 5 produces I4=(Ia×Ib)/I3, such that the current I4 is inversely proportional to the current I3 as desired. The current modifier at 42-44 of FIGS. 4 and 5 is merely one example of many well-known suitable techniques for generating a result current (I4) that is inversely proportional to an input current (I3).

Referring again to FIG. 3, in the example illustrated therein, the relationship between the output current Iout and the input signal frequency Fext is as follows: Iout=Fext×10⁻12. Because the peak value of the voltage at 14 across C4 is maintained at 1.2 volts, the proportionality of Iout to Fext can be adjusted by changing the value of C4.

Although the present invention has been described with exemplary embodiments, various changes and modifications may be suggested to one skilled in the art. It is intended that the present invention encompass such changes and modifications as fall within the scope of the appended claims.

What is claimed is:

1. An apparatus for representing a frequency, comprising:
an input for receiving an input signal having an input frequency;

an output for providing an output signal that represents said input frequency;

a feed-forward path coupled between said input and said output, wherein said feed-forward path includes a voltage-to-current converter that produces a current which represents said input frequency;

a feed-back path coupled to said output and to a node in said feed-forward path, said feed-back path having a time delay associated with operation thereof; and in response to a change in said input frequency from a first frequency value to a second frequency value, said feed-forward path operable independently of said time delay to adjust said output signal from exhibiting a first characteristic that represents said first frequency value to exhibiting a second characteristic that represents said second frequency value.

2. The apparatus of claim 1, wherein said output signal is a current signal.

3. The apparatus of claim 1, wherein said feed-forward path includes a frequency-to-voltage converter.

4. The apparatus of claim 3, wherein said feed-forward path includes a voltage-to-current converter coupled to said frequency-to-voltage converter.

5. The apparatus of claim 3, wherein said frequency-to-voltage converter includes a output and first and second frequency-to-voltage conversion circuits coupled to said output, said first frequency-to-voltage conversion circuit converting a first range of values of said input frequency into a range of voltages at said output, and said second frequency-to-voltage conversion circuit converting a second range of values of said input frequency into said range of voltages at said output, said second range of values of said input frequency differing from said first range of values of said input frequency, and including a decision circuit coupled to said frequency-to-voltage converter for deciding which of said first and second frequency-to-voltage conversion circuits is to drive said output of said frequency-to-voltage converter.

6. The apparatus of claim 5, wherein, for each of said first and second ranges of input frequency values, said frequencies thereof are represented in said voltage range as respective voltages that are inversely proportional to the respectively corresponding frequencies.

7. The apparatus of claim 5, wherein said first frequency-to-voltage conversion circuit includes a first capacitor and said second frequency-to-voltage conversion circuit includes a second capacitor, said second capacitor having a value that bears a predetermined relationship to a value of said first capacitor.

8. The apparatus of claim 7, wherein said input frequency values of said second range bear said predetermined relationship to respectively corresponding input frequency values of said first range.

9. The apparatus of claim 1, wherein said node in said fed-forward path is a current summing node.

10. The apparatus of claim 1, wherein said node of said feed-forward path is a current summing node in said voltage-to-current converter.

11. The apparatus of claim 1, wherein said voltage-to-current converter includes a current modifier for producing a further current in response to said first-mentioned curt, said further current inversely proportional to said first-mentioned current.

12. An apparatus for representing a frequency, comprising:

an input for receiving an input signal having an input frequency;

a frequency-to-voltage converter coupled to said input said frequency-to-voltage converter including an output and first and second frequency-to-voltage conversion circuits coupled to said output, said first frequency-to-voltage conversion circuit converting a first range of values of said input frequency into a range of voltages at said output, and said second frequency-to-voltage conversion circuit converting a second range of values of said input frequency into said range of voltages at said output, said second range of values of said input frequency differing from said first range of values of said input frequency; and a decision circuit coupled to said frequency-to-voltage converter for deciding which of said first and second frequency-to-voltage conversion circuits is to drive said output of said frequency-to-voltage converter.

13. The apparatus of claim 12, wherein, for each of said first and second ranges of input frequency values, said frequencies thereof are represented in said voltage range as respective voltages that are inversely proportional to the respectively corresponding frequencies.

14. The apparatus of claim 12, wherein said first frequency-to-voltage conversion circuit includes a first capacitor and said second frequency-to-voltage conversion circuit includes a second capacitor, said second capacitor having a value that bears a predetermined relationship to a value of said first capacitor.

15. The apparatus of claim 14, wherein said input frequency values of said second range bear said predetermined relationship to respectively corresponding input frequency values of said first range.

16. The apparatus of claim 12, including a voltage-to-current converter coupled to said output of said frequency-to-voltage converter for producing a current that represents said input frequency.

17. The apparatus of claim 16, wherein said voltage-to-current converter includes a current modifier for producing in response to said first-mentioned current a further current that is inversely proportional to said first-mentioned current.

18. A method of producing a signal representation of an input frequency, comprising:

using a range of voltages to represent a first range of input frequencies during a first time period;

using said range of voltages to represent a second range of input frequencies that differs from said first range of input frequencies during a second time period; and distinguishing between the first time period when said range of voltages is used to represent said first range of input frequencies and the second time period when said range of voltages is used to represent said second range of input frequencies.

\* \* \* \* \*